(12) United States Patent
Adachi (10) Patent No.: US 9,190,308 B2
(45) Date of Patent: Nov. 17, 2015

(54) ELECTROSTATIC CHUCK SYSTEM AND SEMICONDUCTOR FABRICATION DEVICE

(71) Applicant: NISSIN ION EQUIPMENT CO., LTD., Kyoto-shi, Kyoto (JP)

(72) Inventor: Masakazu Adachi, Kyoto (JP)

(73) Assignee: NISSIN ION EQUIPMENT CO., LTD., Kyoto (JP)

( * ) Notice: Subject to any disclaimer, the term of this patent is extended or adjusted under 35 U.S.C. 154(b) by 128 days.

(21) Appl. No.: 14/221,038

(22) Filed: Mar. 20, 2014

(65) Prior Publication Data

US 2015/0009602 A1 Jan. 8, 2015

(30) Foreign Application Priority Data

Jul. 5, 2013 (JP) ................................. 2013-141349

(51) Int. Cl.
- *H01L 21/683* (2006.01)
- *H01T 23/00* (2006.01)
- *H01L 21/67* (2006.01)

(52) U.S. Cl.
CPC ...... *H01L 21/6833* (2013.01); *H01L 21/67248* (2013.01)

(58) Field of Classification Search
CPC . H01L 21/6833; H01L 21/6831; H02N 13/00
USPC ......................................................... 361/234
See application file for complete search history.

(56) References Cited

U.S. PATENT DOCUMENTS

| | | | |
|---|---|---|---|
| 6,416,618 B2* | 7/2002 | Tsuchihashi | C23C 16/4586 118/723 E |
| 6,566,632 B1* | 5/2003 | Katata | H01L 21/67103 219/444.1 |
| 6,778,377 B2 | 8/2004 | Hagi | |
| 6,847,014 B1* | 1/2005 | Benjamin | H01L 21/67248 219/444.1 |
| 6,905,984 B2* | 6/2005 | Kellerman | H01L 21/6831 438/597 |
| 7,479,456 B2* | 1/2009 | Buchberger, Jr. | H01L 21/67109 438/706 |
| 9,117,867 B2* | 8/2015 | Hwang | H01L 21/6833 |
| 2002/0170882 A1 | 11/2002 | Akiba | |
| 2010/0020463 A1* | 1/2010 | Nasman | H02N 13/00 361/234 |

FOREIGN PATENT DOCUMENTS

| | | |
|---|---|---|
| JP | 2002-270680 A | 9/2002 |
| JP | 2008-277609 A | 11/2008 |
| JP | 2012-64971 A | 3/2012 |

* cited by examiner

*Primary Examiner* — Dharti Patel
(74) *Attorney, Agent, or Firm* — Procopio, Cory, Hargreaves & Savitch LLP (57) ABSTRACT

An electrostatic chuck system comprising a chuck body 1 having a clamping face 4 for electrostatically clamping a substrate 5, an electrode portion 2 generating a clamping force on the clamping face 4, a temperature-regulating portion 3 regulating the temperature of the substrate 5 to maintain it at a predetermined level, and a controller 10 controlling the voltage applied to the electrode portion 2, wherein, prior to completion of the electrostatic clamping of the substrate 5 to the chuck body 1, a voltage waveform obtained by superimposing a first waveform, which changes in a stepwise, rectilinear, or quadratic manner between a first level and a second level having a larger absolute value than the first level, and a periodic second waveform, which may be any of a rectangular wave, a triangular wave, a saw-tooth wave, or a sine wave, is applied by the controller 10 to the electrode portion 2.

7 Claims, 9 Drawing Sheets

RELATED ART

FIG. 9(B)

ELECTROSTATIC CHUCK SYSTEM AND SEMICONDUCTOR FABRICATION DEVICE

CROSS-REFERENCE TO RELATED APPLICATIONS

The present application claims priority to Japanese Patent Application No. 2013-141349, filed on Jul. 5, 2013, the content of which is hereby incorporated by reference in its entirety.

BACKGROUND

1. Technical Field

The present invention relates to an electrostatic chuck system used in semiconductor fabrication processes involving substrate heating or cooling and to a semiconductor fabrication device equipped therewith.

2. Background Art

Semiconductor fabrication devices include devices that control substrate temperature to maintain it at a predetermined level. Such devices are provided with heating and cooling means for controlling substrate temperature. Depending upon the configuration of the devices, there are devices having only heating or only cooling means, and devices having both heating and cooling means. Well-known examples of specific semiconductor fabrication devices include sputtering devices, thin film deposition devices, and ion implanters.

When temperature control is performed with the aim of controlling the temperature of a substrate (for example, a semiconductor wafer made of silicon, silicon carbide, gallium nitride, indium phosphide, and the like, an article obtained by forming a film on the front and back surfaces of said wafer, or a glass substrate) in order to maintain it at an elevated or low level, the larger the difference between the target preset temperature and room temperature, the greater the warpage generated in the substrate. The extent of such warpage varies with the type and dimensions of the target substrate.

In many semiconductor fabrication devices, a substrate is electrostatically clamped to a stage using an electrostatic chuck and the electrostatically clamped substrate is then processed. In devices that process substrates after setting the temperature of the substrates to an elevated or low level, normal processing of substrate surfaces to be treated (e.g., surfaces subjected to ion implantation treatment) may be prevented by the warpage generated in the substrates.

Technology used to mitigate such substrate warpage is described, for instance, in Patent Citation 1. According to Patent Citation 1, when a substrate is disposed on a base member with a built-in heater and the substrate is electrostatically clamped, the rate of substrate temperature rise is smoothed out by changing the clamping voltage in a stepwise manner. This makes it possible to reduce substrate warpage in comparison with approaches in which a high clamping voltage is applied from the very beginning.

PRIOR ART CITATIONS

Patent Citations

[Patent Citation 1]
Japanese Patent Application Publication No. 2002-270680.

SUMMARY

Figure 9A:
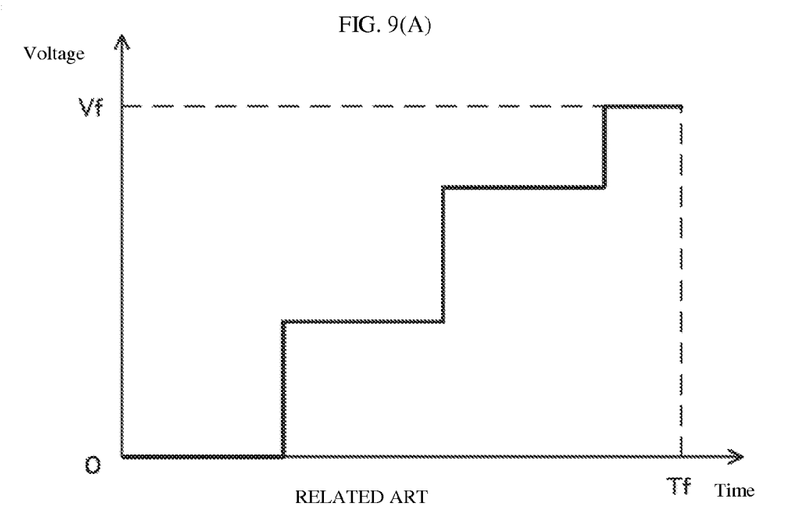
[FIGS. 9(A)-9(B)] An illustration of prior-art problems.

The stepwise switching of the clamping voltage is depicted in FIG. 9(A). In accordance with the technology described in Patent Citation 1, the clamping voltage remains at a constant level during the period when no switching of the clamping voltage takes place in the process of modifying the clamping voltage in a stepwise manner. If this period is extended, the substrate ends up getting tightly clamped to the electrostatic chuck and it is impossible to relieve the thermal stress generated in the substrate. In the absence of thermal stress relief, the substrate is subject to warpage and cracking.

Figure 9B:
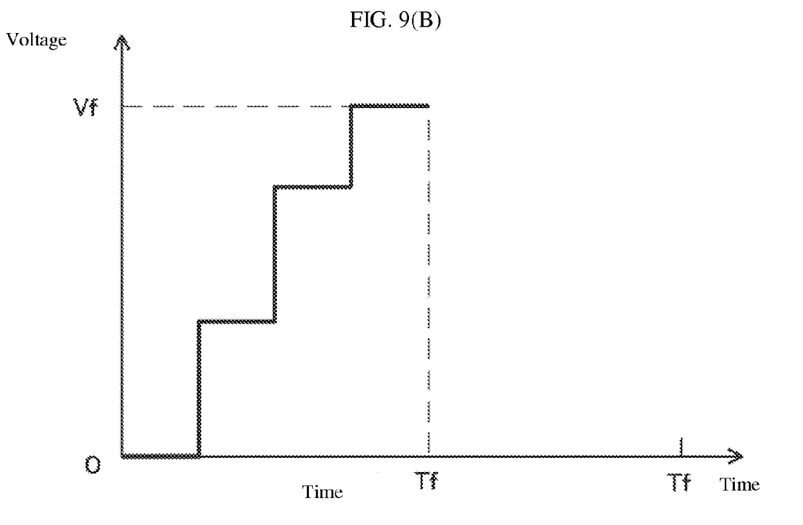

To solve such problems, it has been contemplated to shorten the time it takes to switch the clamping voltage, as is schematically described in FIG. 9(B). However, in such a case, as can be appreciated from a comparison between FIG. 9(A) and FIG. 9(B), the time it takes to reach the predetermined voltage Vf applied upon completion of electrostatic clamping is made shorter. Consequently, the substrate ends up getting clamped to the electrostatic chuck at an early stage, which makes the rate of substrate temperature rise steeper and increases the chances of generating considerable warpage in the substrate.

With the above-noted problems in mind, it is the primary object of the present invention to provide an electrostatic chuck system which, along with effectively relieving stress induced by changes in substrate temperature during the electrostatic clamping of a substrate, is capable of mitigating deformation due to substrate warpage, as well as to provide a semiconductor fabrication device equipped therewith.

The electrostatic chuck system is an electrostatic chuck system comprising a chuck body having a clamping face for electrostatically clamping a substrate, an electrode portion generating a clamping force on the clamping face, a temperature regulating portion regulating the temperature of the substrate to maintain it at a predetermined level, and a controller controlling the voltage applied to the electrode portion, wherein, prior to completion of the electrostatic clamping of the substrate to the chuck body, the controller applies voltage to the electrode portion based on a voltage waveform obtained by superimposing a first waveform, which changes in a stepwise, rectilinear, or quadratic manner between a first level and a second level having a larger absolute value than the first level, and a periodic second waveform, which is any of a rectangular wave, a triangular wave, a saw-tooth wave, or a sine wave.

Two types of waveforms with different characteristics are superimposed and used as a voltage waveform that is applied to the electrode portion. Accordingly, the temperature of the substrate can be changed smoothly with the help of a first waveform component, which changes in a stepwise, rectilinear, or quadratic manner between a first level and a second level having a larger absolute value than the first level. Additionally, stress generated by changes in substrate temperature can be effectively relieved with the help of a periodic second waveform component, which may be any of a rectangular wave, a triangular wave, a saw-tooth wave, or a sine wave. A synergistic combination of their action and effects allows for substrate warpage and cracking to be effectively minimized.

The amplitude of the second waveform may be constant over time.

Waveform generation is facilitated if the amplitude is made constant.

The second waveform may be a rectangular wave, and the controller may be configured to modify at least one of a duty ratio, a period, or an amplitude of the second waveform based at least on the temperature of the substrate.

Substrate temperature affects substrate warpage and cracking. For example, if upon lapse of a certain period of time the temperature of a substrate exceeds a preset temperature used as a reference, then the rate of substrate temperature rise is higher than expected. Accordingly, in order to lower the rate of temperature rise, it is contemplated to modify the duty ratio of the rectangular wave such that its convex portions are made sufficiently smaller than its concave portions, to shorten the period of the rectangular wave, or to modify its amplitude in order to make it smaller. With such a configuration, substrate warpage and cracking can be prevented more effectively.

On the other hand, the second waveform may be a triangular wave, a saw-tooth wave, or a sine wave, and the controller may be configured to modify at least one of the period or amplitude of the second waveform based at least on the temperature of the substrate.

Selecting a triangular wave, a saw-tooth wave, or a sine wave as the second waveform produces effects equivalent to those of the above-noted rectangular wave and, in addition, makes regions of high absolute values smaller in comparison with the rectangular wave, thereby decreasing the likelihood that the substrate will end up getting clamped to the electrostatic chuck.

The second waveform may be any of a triangular wave, a saw-tooth wave, or a sine wave, and the controller may increase the amplitude of the second waveform over time.

Furthermore, if desired, to make the rate of substrate temperature rise steeper, it is sufficient to increase the amplitude of the second waveform over time. In this manner, the rate of substrate temperature rise can be controlled using the second waveform.

The magnitude of the voltage applied by the voltage waveform is preferably greater than 0V in absolute value, except at the start of electrostatic clamping.

Although the clamping voltage may be at 0V while the substrate is being clamped by the electrostatic chuck, if it set to 0V, there is a risk that the substrate will bounce off the electrostatic chuck under the action of the stress caused by the changes in substrate temperature. In order to minimize such substrate bouncing, it is desirable to set the clamping voltage to a level greater than 0V in absolute value, except immediately after the beginning of electrostatic clamping.

Additionally, the semiconductor fabrication device can be a device equipped with the above-described electrostatic chuck system and a vacuum vessel, in which the chuck body of the electrostatic chuck system is disposed.

EFFECTS OF THE INVENTION

Two types of waveforms with different characteristics are superimposed and used as a voltage waveform that is applied to the electrode portion. Accordingly, the temperature of the substrate can be changed smoothly with the help of a first waveform component, which changes in a stepwise, rectilinear, or quadratic manner between a first level and a second level having a larger absolute value than the first level. Additionally, stress generated by changes in substrate temperature can be effectively relieved with the help of a periodic second waveform component, which may be any of a rectangular wave, a triangular wave, a saw-tooth wave, or a sine wave. A synergistic combination of their action and effects allows for substrate warpage and cracking to be effectively minimized.

DETAILED DESCRIPTION

The configuration of the inventive electrostatic chuck system will be explained below.

Figure 1:
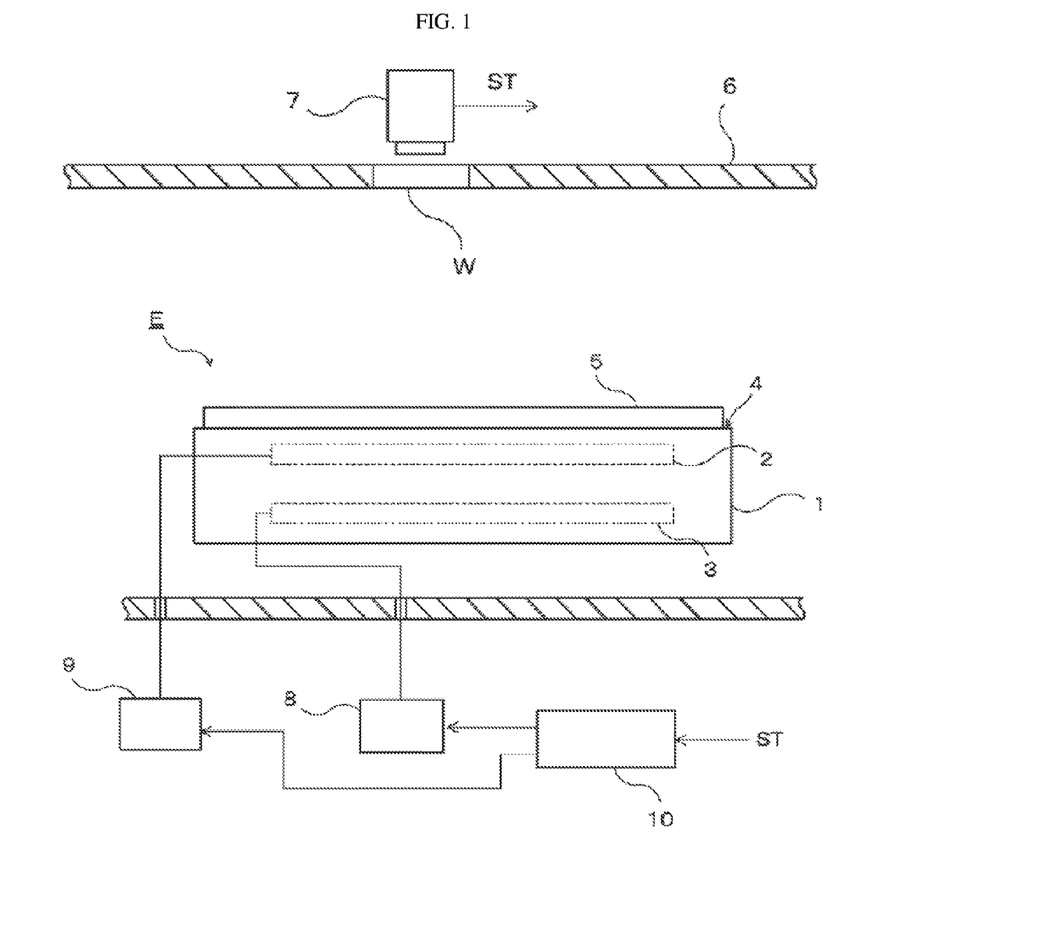
[FIG. 1] A schematic diagram illustrating the configuration of the electrostatic chuck system.

FIG. 1 is a schematic diagram of the electrostatic chuck system, in which a substrate 5 is held in a processing chamber 6. An electrostatic chuck E is constituted mainly by a chuck body 1. A clamping face 4 used to clamp the substrate 5 is formed on the front face of the chuck body 1.

An electrode portion 2 is embedded in the chuck body 1 underneath the clamping face 4. Generally speaking, in an electrostatic chuck referred to as "monopolar-type," the electrode portion 2 is made up of a single large electrode, and in an electrostatic chuck referred to as "bipolar-type," the electrode portion 2 is made up of two electrodes, to which voltage of different polarities is applied. In addition, in an electrostatic chuck referred to as "multipolar-type," the electrode portion 2 is made up of two or more multiple electrodes. The electrode portion 2 contemplated herein is assumed to have an electrode configuration conventionally employed for electrostatic chucks and may have any number of electrodes.

A clamping power supply 9 is connected to the electrode portion 2. A voltage is applied to the electrode portion 2 through the clamping power supply 9, which generates a Coulomb's force and a Johnsen-Rahbek force between the clamping face 4 and the substrate 5, thereby electrostatically clamping the substrate 5. It should be noted that despite the fact that only one clamping power supply 9 is illustrated in the drawing, their number is appropriately modified depending on the number of the electrodes that constitute the electrode portion 2 and on whether the voltage is supplied to each electrode independently or in conjunction.

In addition to the electrode portion 2, the chuck body 1 is provided with a temperature regulating portion 3. In this example, the temperature of the substrate 5 (for example, a semiconductor wafer made of silicon, silicon carbide, gallium nitride, indium phosphide, and the like, an article obtained by forming a film on the front and back surfaces of said wafer, or a glass substrate) is raised before the substrate 5 is processed. The temperature regulating portion 3 regulates the temperature of the chuck body 1. Specifically, it is a heating element, such as an electrical heating coil, a ceramic heater, a PG/PBN heater, and the like.

A heating power supply 8 is connected to the temperature regulating portion 3 and the output of the temperature regulating portion 3 is regulated through this power supply. If the output of the temperature regulating portion 3 is regulated and the temperature of the chuck body 1 is raised, the temperature of the substrate 5 is increased. When the target substrate temperature is an elevated temperature, the temperature of the temperature regulating portion 3 is usually raised before the substrate 5 is placed on the clamping face 4. In the inventive configuration, the temperature of the chuck body 1 is elevated to a certain extent due to the increase in the temperature of the temperature regulating portion 3 during the stage when the substrate 5 is placed on the clamping face 4 and the operation of electrostatic clamping of the substrate 5 is initiated.

The electrostatic chuck system is provided with a controller 10. The controller 10 is a device that controls the output of the heating power supply 8 and clamping power supply 9 described above. In addition, as depicted in FIG. 1, a window W may be provided in a portion of the processing chamber 6 and the surface temperature of the substrate 5 may be measured through the window W using a radiation thermometer 7. It is contemplated to use a configuration in which results obtained from such measurements are sent to the controller 10 as a signal ST and the outputs of the clamping power supply 9 and heating power supply 8 are controlled based on the surface temperature of the substrate 5.

Although as described herein the surface temperature of the substrate 5 is measured using the radiation thermometer 7, the temperature of the chuck body 1 may be measured using a thermocouple or the like. In such a case, the temperature of the substrate 5 is measured indirectly because what is measured is a location associated with the substrate 5. It should be noted that from the standpoint of the warpage of the substrate 5 the temperature of the substrate 5 becomes a more important factor than the temperature of the chuck body 1, and it is therefore desirable that the temperature of the substrate 5 be measured directly and control be exercised based on the results of such measurements.

Figure 2A:
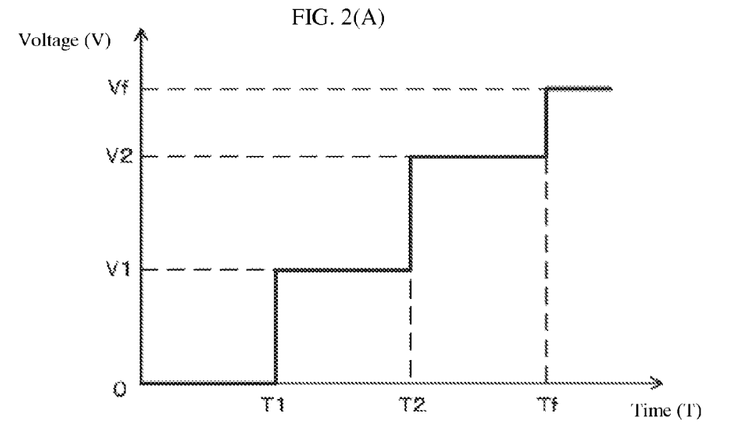
[FIGS. 2(A)-2(C)] Illustrates waveforms 1-3 applied to the electrode portion. (A) is the first waveform, and (B) is the second waveform. (C) illustrates a third waveform obtained by superimposing the two waveforms.
Figure 2B:
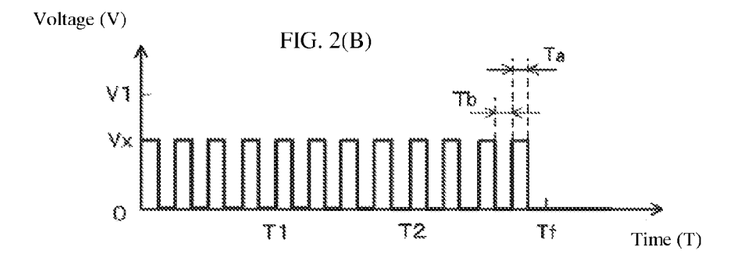
Figure 2C:
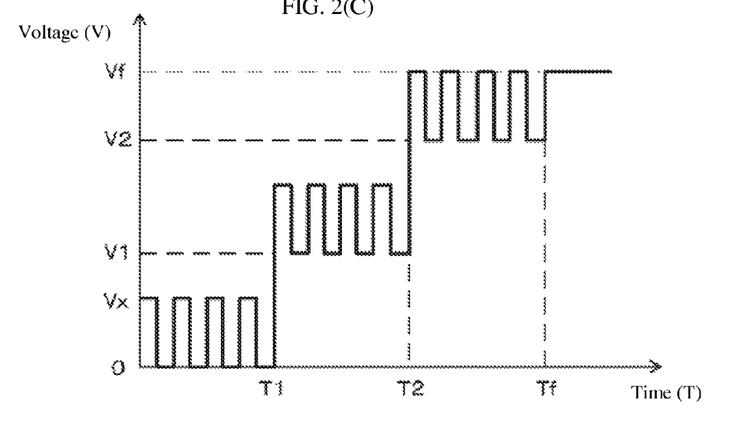

Once the substrate 5 is electrostatically clamped to the clamping face 4, a constant voltage is applied to the electrode portion 2. If the constant voltage applied upon completion of electrostatic clamping is applied from the very beginning of the operation of electrostatic clamping, the substrate 5 ends up getting completely clamped to the clamping face 4 and the temperature of the substrate 5 is rapidly increased. When that happens, considerable warpage occurs in the substrate 5. To avoid such problems, in the present invention, in the same manner as in Patent Citation 1, the final voltage (the constant voltage applied upon completion of the electrostatic clamping of the substrate 5) is not applied to the electrode portion 2 in an abrupt manner. FIG. 2 is used to describe the specific applied voltages that are used.

FIG. 2(A)-(C) illustrates three voltage waveforms. The voltage waveform depicted in FIG. 2(A) is the voltage waveform used in Patent Citation 1, i.e. a waveform changing in a stepwise manner. The magnitude (absolute value) of the voltage (V) is plotted along the vertical axis and the elapsed time (T) is plotted along the horizontal axis. In the present invention this voltage waveform is referred to as the first waveform. The voltage Vf shown in FIG. 2(A) is the above-mentioned final voltage applied to the electrode portion 2 upon completion of electrostatic clamping. In addition, the origin represents the beginning of the operation of electrostatic clamping.

In this example, the voltage level (V=0) at the beginning of the electrostatic clamping operation is defined as the first level and the voltage V2 illustrated in the figure is defined as the second level, and, before the electrostatic clamping of the substrate 5 to the chuck body 1 is finished, the first waveform is changed in a stepwise manner between the two voltage levels. In addition, the first and second waveforms subsequent to completion of electrostatic clamping are determined by considering the voltage level that the final voltage applied to the electrode portion 2 should be set to.

Although in the case of bipolar electrostatic chucks, it is contemplated that the voltage value applied to the electrode portion 2 may be positive and negative, in FIG. 2(A)-(C) and other drawings described hereafter, for ease of explanation, the concept of polarity is not used for the applied voltage in the description. For this reason, despite the fact that a positive voltage appears to be applied to the electrode portion 2, in fact it is not. If the polarity of the voltage is considered and it is assumed, for example, that the voltage waveforms depicted in FIG. 2(A)-(C) are voltage waveforms obtained when a positive voltage is applied to the electrode portion 2, then voltage waveforms obtained when a negative voltage is applied to the electrode portion 2 can be imagined by flipping the voltage waveforms illustrated in the drawings vertically about the time axis.

The voltage waveform depicted in FIG. 2(B) is a periodic rectangular wave with an amplitude of Vx. In this drawing, the duty ratio (Ta:Tb) of the convex portions to the concave portions of the rectangular wave is set to 1:1, and the voltage waveform depicted in FIG. 2(B) is referred to herein as the "second waveform."

FIG. 2(C) depicts a voltage waveform obtained by superimposing the first waveform depicted in FIG. 2(A) and the second waveform depicted in FIG. 2(B). The controller 10 is used to apply a voltage to the electrode portion 2 based on the voltage waveform depicted in FIG. 2(C).

The voltage waveform of FIG. 2(A), which serves as a basis for the voltage waveform depicted in FIG. 2(C), is a voltage waveform that changes in the same stepwise manner as the one in Patent Citation 1. Therefore, in the same manner as in Patent Citation 1, the effect that is produced is that the temperature of the substrate 5 increases in a smooth manner. Furthermore, in the inventive voltage waveform, before the electrostatic clamping of the substrate 5 to the chuck body 1 (0<T<Tf) is finished, the periods of constant clamping voltage are extremely short. This is due to the superimposition of the second waveform. As a result, extraordinary effects are produced that make the clamping of the substrate 5 to the clamping face 4 incomplete, thereby allowing for the thermal stress of the substrate 5 to be effectively relieved during the operation of electrostatic clamping.

In the embodiment described in FIG. 2, there is a period during which the clamping voltage is zero between the beginning of the operation of electrostatic clamping and time T1. Although the clamping voltage may be at 0V while the substrate 5 is clamped by the electrostatic chuck E, setting it to 0V carries the risk that the substrate 5 will bounce off the electrostatic chuck E under the action of the stress caused by the changes in the temperature of the substrate 5. In order to minimize such bouncing of the substrate 5, it is better to set the clamping voltage to a level greater than 0V in absolute value starting from the beginning of electrostatic clamping.

Figure 3A:
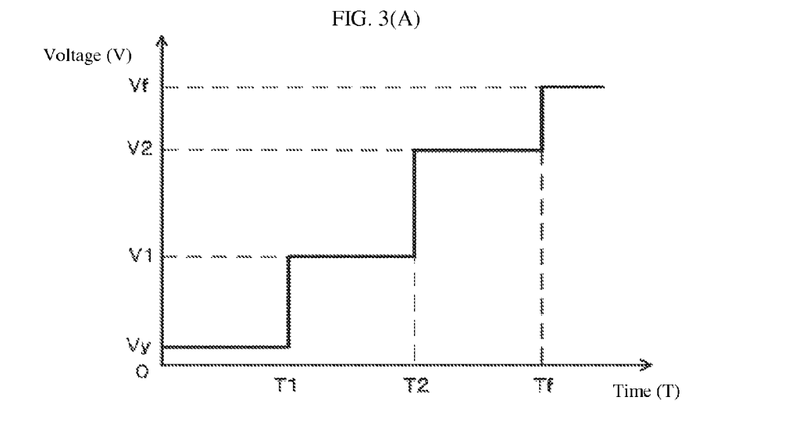
[FIGS. 3(A)-3(C)] Illustrates a variation of the third waveform of FIGS. 2(A)-2(C).
Figure 3B:
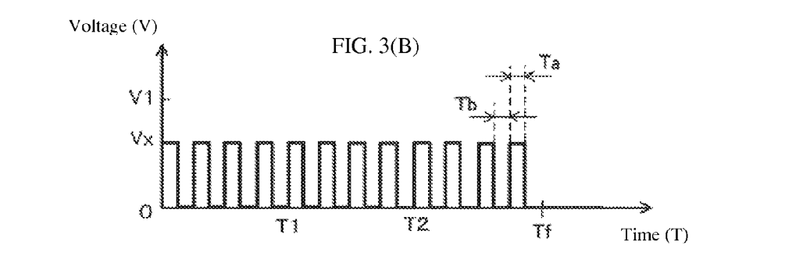

Specifically, as described in FIG. 3(A), the voltage level used between the beginning of clamping and time T1 in the first waveform is set to a value greater than zero in absolute value. The expression "absolute value" is used here to imply that application of negative voltages in a bipolar electrostatic chuck, as described above, is also taken into consideration. In the first waveform depicted in FIG. 3(A), the voltage level used between the beginning of the operation of electrostatic clamping and time T1 is set to a value somewhat higher than 0V. In addition, if the second waveform depicted in FIG. 3(B) is identical to the one in FIG. 2(B), then the voltage waveform applied to the electrode portion 2 will be just like the waveform depicted in FIG. 3(C).

Figure 3C:
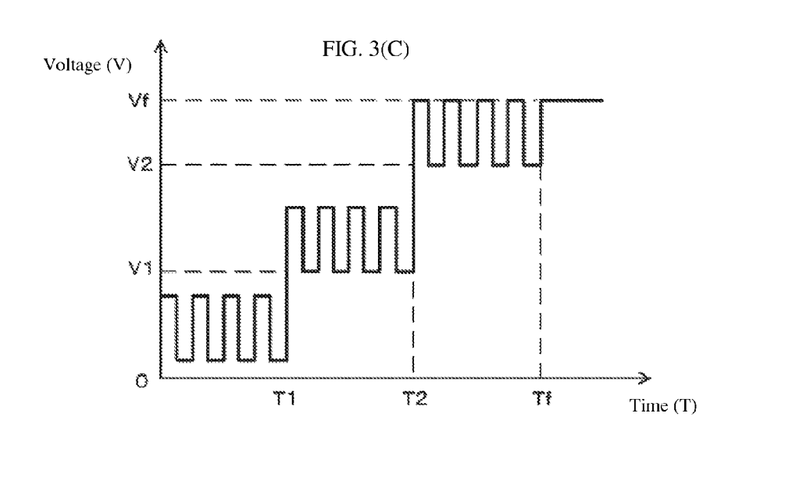

The use of such a voltage waveform makes it possible to mitigate the problem of bouncing of the substrate 5 during the operation of electrostatic clamping. In this example, the voltage level Vy at the beginning of the operation of electrostatic clamping is defined as the first level and the voltage V2 illustrated in the figure is defined as the second level, and, before the electrostatic clamping of the substrate 5 to the chuck body 1 is finished, the first waveform is changed in a stepwise manner between the two voltage levels.

Figure 4A:
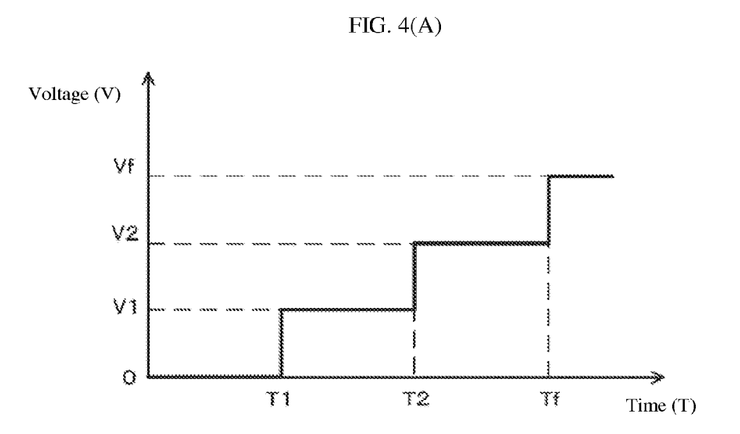
[FIGS. 4(A)-4(C)] Illustrates another variation of the third waveform of FIGS. 2(A)-2(C).
Figure 4B:
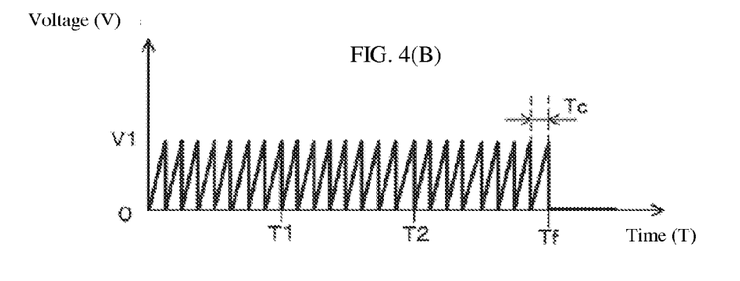
Figure 4C:
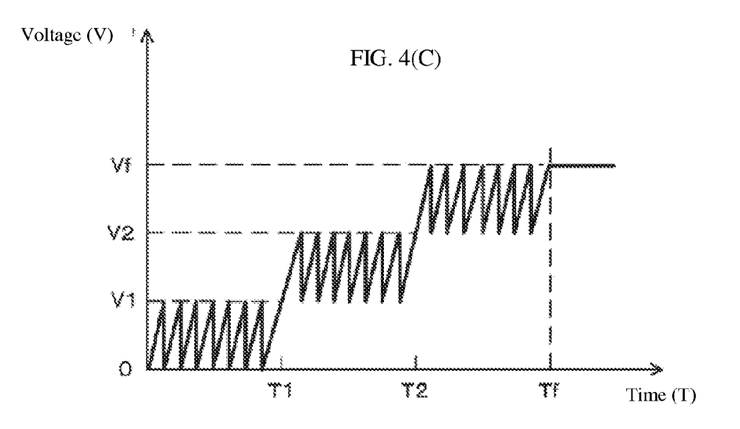

The second waveform, which is superimposed on the first waveform, does not have to be a rectangular wave. For example, a saw-tooth wave, such as the one depicted in FIG. 4, may also be used. FIG. 4(A)-(C) describes an example in which a saw-tooth wave with an amplitude of V1 and a period of Tc is used as the second waveform. In the case of a rectangular wave, there is a time period, albeit extremely short, during which the applied voltage remains constant. In such a saw-tooth wave, the time period during which the applied voltage remains constant can be essentially eliminated, which makes using this waveform more effective from the standpoint of relieving the thermal stress of the substrate 5.

Figure 5A:
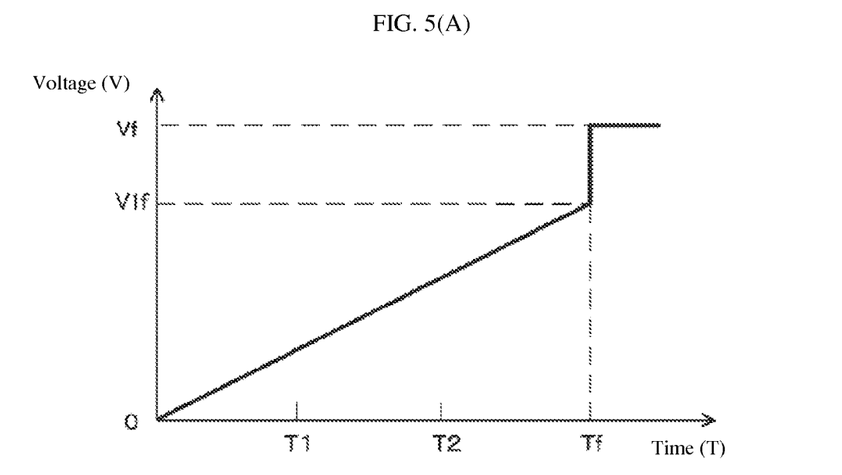
[FIG. 5(A)-5(C)] Illustrates yet another variation of the third waveform of FIGS. 2(A)-2(C).
Figure 5B:
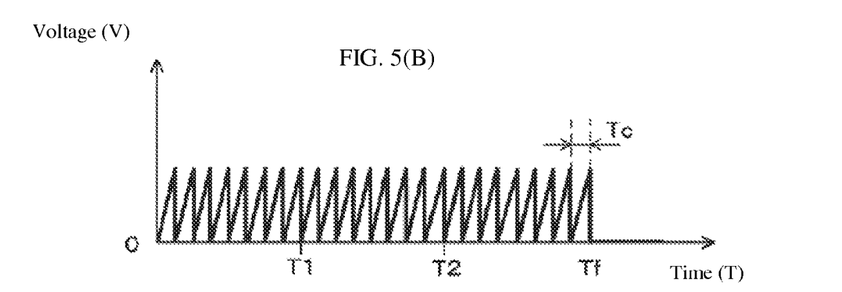
Figure 5C:
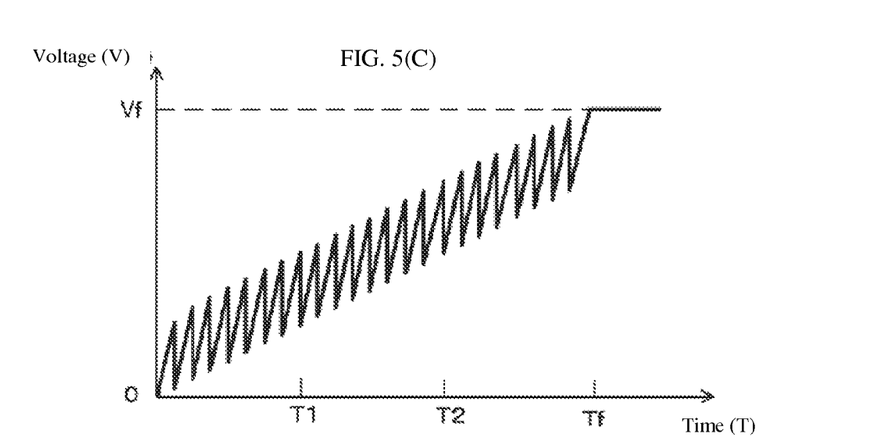

Although a voltage waveform that changes in a stepwise manner has been used as the first waveform in the embodiments set forth hereinabove, a voltage waveform that changes in a rectilinear manner, such as the one described in FIG. 5(A), may be used as the first waveform if the rate of temperature rise of the substrate 5 is sufficiently smooth. As can be seen from FIG. 5(B), the saw-tooth wave described in FIG. 4(B) is used as the second waveform in the embodiment of FIG. 5. The voltage waveform depicted in FIG. 5(C) is a waveform obtained by superimposing these first and second waveforms. Effects equivalent to the embodiments described hereinabove can be obtained even if the voltage applied to the electrode portion 2 is controlled based on such a voltage waveform. In this example, the voltage level (V=0) at the beginning of the operation of electrostatic clamping is defined as the first level and the voltage V if illustrated in the figure is defined as the second level, and, before the electrostatic clamping of the substrate 5 to the chuck body 1 is finished, the first waveform is changed in a rectilinear manner between the two voltage levels.

Figure 6A:
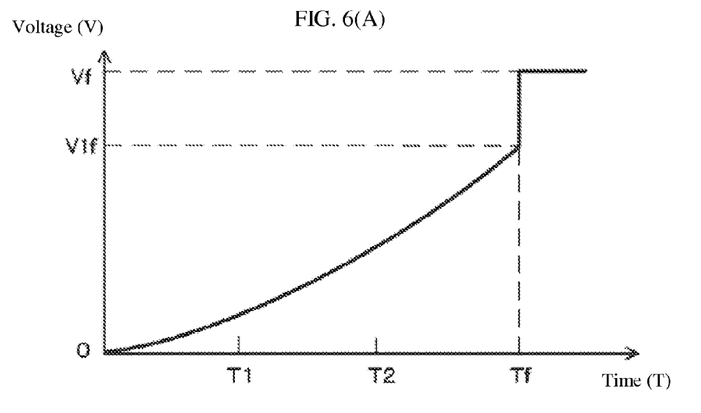
[FIG. 6(A)-6(C)] Illustrates still another variation of the third waveform of FIGS. 2(A)-2(C).
Figure 6B:
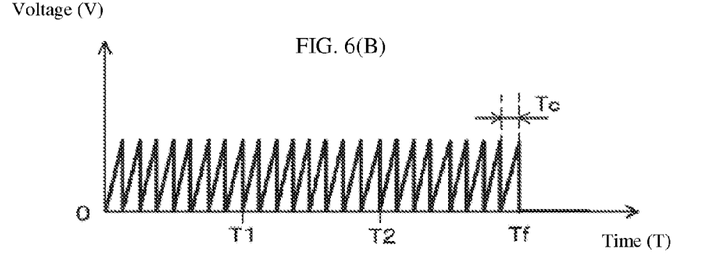
Figure 6C:
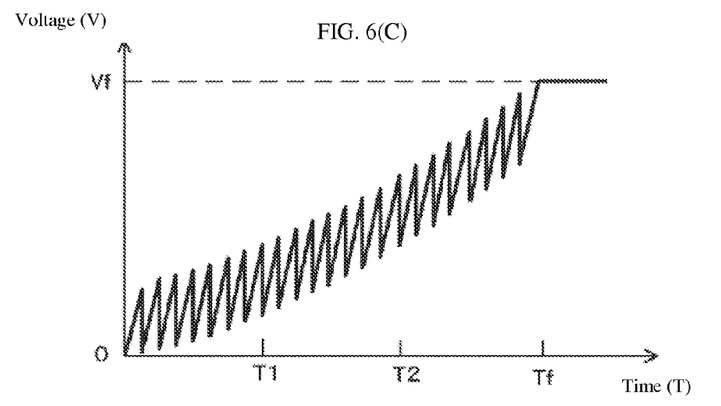

In addition, the first waveform may be a waveform that changes in a quadratic manner. Such an embodiment is depicted in FIG. 6. FIG. 6(A) represents a first waveform that changes in a quadratic manner, and FIG. 6(B) depicts a saw-tooth wave identical to the one used in the embodiments of FIG. 4 and FIG. 5. The voltage waveform depicted in FIG. 6(C) is a waveform obtained by superimposing these first and second waveforms. Effects equivalent to the embodiments described hereinabove can be obtained even if the voltage applied to the electrode portion 2 is controlled based on such a voltage waveform. In this example, the voltage level (V=0) at the beginning of the operation of electrostatic clamping is defined as the first level and the voltage V1f illustrated in the figure is defined as the second level, and, before the electrostatic clamping of the substrate 5 to the chuck body 1 is finished, the first waveform is changed in a quadratic manner between the two voltage levels.

Figure 7A:
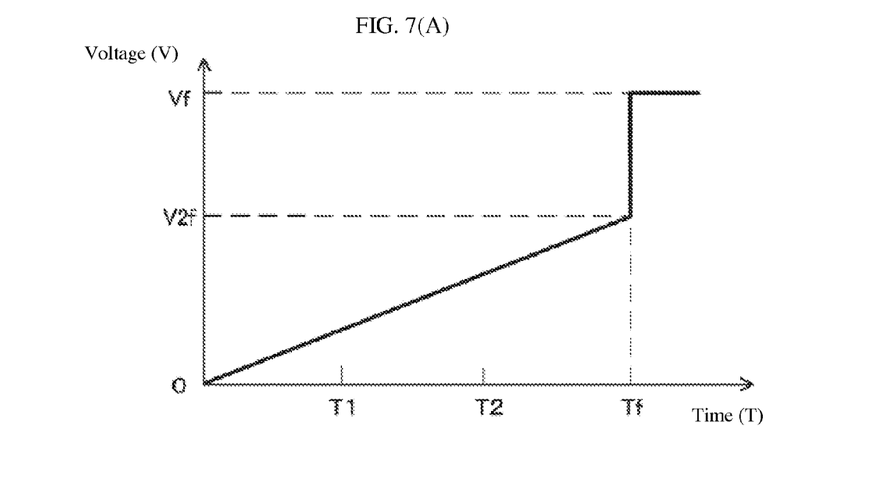
[FIGS. 7(A)-7(C)] Illustrates still another variation of the third waveform of FIGS. 2(A)-2(C).
Figure 7B:
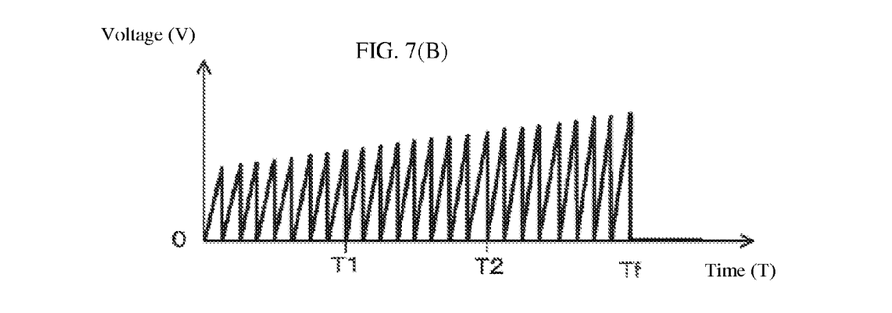
Figure 7C:
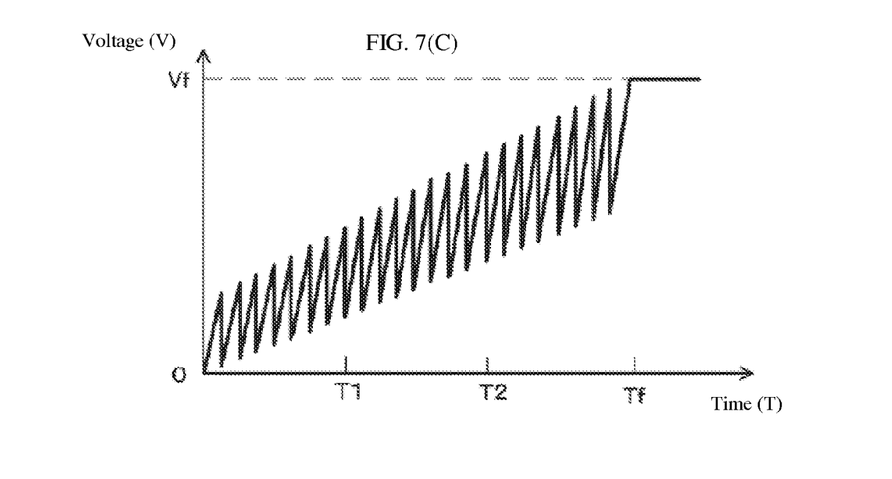

Furthermore, the amplitude of the second waveform may be varied. For example, it may look like the embodiment described in FIG. 7. A first waveform, which changes in a rectilinear manner similar to the embodiment of FIG. 5, is depicted in FIG. 7(A). A second waveform, which is a saw-tooth whose amplitude gradually increases with time, is depicted in FIG. 7(B). A voltage waveform obtained by superimposing the first waveform and the second waveform is depicted in FIG. 7(C). Effects equivalent to the embodiments described hereinabove can be obtained even when the voltage applied to the electrode portion 2 is controlled based on the voltage waveform of FIG. 7(C). In this example, the voltage level (V=0) at the beginning of the operation of electrostatic clamping is defined as the first level and the voltage V2f illustrated in the figure is defined as the second level, and, before the electrostatic clamping of the substrate 5 to the chuck body 1 is finished, the first waveform is changed in a rectilinear manner between the two voltage levels.

Although in the embodiment of FIG. 7 the amplitude of the second waveform was configured to increase with time, it can also be reduced with time. In addition, the variable parameters are not limited to the amplitude, and may include the duty ratio (the ratio of Ta to Tb) and the period (the sum of Ta and Tb) of the rectangular wave, or the period Tc of the saw-tooth wave.

Figure 8:
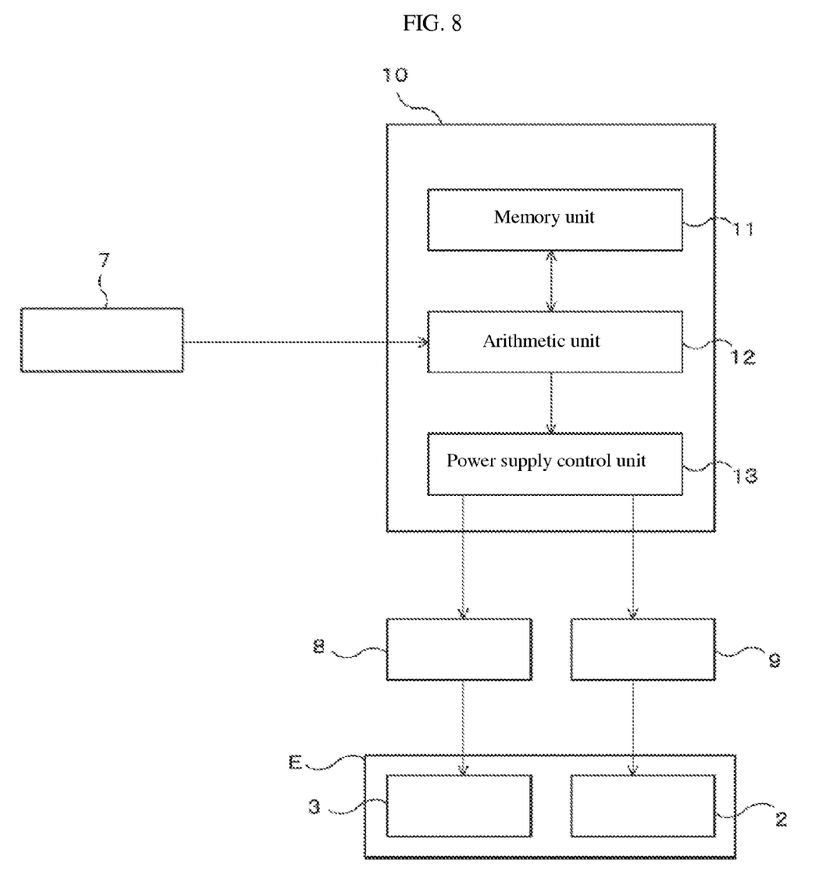
[FIG. 8] A block diagram illustrating an exemplary controller configuration.

The voltage waveform may be modified while processing a substrate. FIG. 8 is used to explain how it is modified.

FIG. 8 is a block diagram illustrating the relationship between a controller 10 and peripheral devices associated therewith. The controller 10 is provided with a memory unit 11, with data concerning the ideal rate of temperature rise of the substrate 5, which is obtained in advance from experiments, etc., stored in this memory unit 11. In addition, data concerning changes in the temperature of the substrate 5 depending on the amount of change in the setting voltages of various power supplies (clamping power supply 9, heating power supply 8) connected to the temperature regulating portion 3 and the electrode portion 2 is accumulated in the memory unit 11.

The measurement results obtained with the help of the radiation thermometer 7 are sent to the arithmetic unit 12 of the controller 10 and, in the arithmetic unit 12, a comparison is performed against the data representing the ideal rate of temperature rise stored in the memory unit 11. If as a result of the comparison the actual substrate temperature does not coincide with the ideal substrate temperature, the arithmetic unit 12 calculates a temperature difference between the actual substrate temperature and the ideal substrate temperature, reads out data regarding changes in the temperature of the substrate 5 and the amount of change in the setting voltages of the power supplies stored in the memory unit 11, and sends a signal to a power supply control unit 13 to change the level of the setting voltage of the power supply based on this data. In this configuration, data concerning the applied voltage waveform is modified at such time by re-creating a new waveform for the second waveform etc., and each power supply is controlled in accordance with the newly re-created voltage waveform.

In addition, one should consider the problem that, since waveform shaping requires time, realistic real-time control is difficult, and, in addition, it becomes impossible to obtain the properties expected of the previous voltage waveform as a result of changes in the clamping face 4 and the like of the electrostatic chuck E that happen over time.

In response to these problems, it is contemplated, for example, to use the following configuration. A semiconductor fabrication device processes multiple substrates on a lot-by-lot basis. If, for example, the substrates are processed in serial manner, then after electrostatically clamping each substrate, the temperature of the substrate is measured and temperature rise rate data for the substrate is created by plotting this data in temporal sequence. Subsequently, the resultant temperature rise rate data is compared with data concerning the ideal temperature rise rate. If, as a result of the comparison, the gap between the actual data and the ideal data turns out to be large, the voltage waveform is subjected to waveform shaping either before processing the next substrate or before processing the next lot.

Changing the substrates requires time, and this time can be used to perform waveform shaping. The new voltage waveform obtained by waveform shaping is stored in the memory unit 11 of the controller 10. Then, while processing the next substrate or the next lot of substrates, the new voltage waveform stored in the memory unit 11 is read out and electrostatic clamping is performed based thereon. Using such a configuration makes it possible to solve the above-described problems.

<Other Variations>

While FIG. 1 depicts an example in which the temperature-regulating portion 3 is provided inside the chuck body 1, the temperature-regulating portion 3 may also be disposed outside the chuck body 1. For example, an approach may be used in which the surface of the substrate 5 is heated directly using a microwave-generating source disposed outside the chuck body 1. In such a case, the temperature-regulating portion 3 serves as the microwave-generating source. In addition, an infrared ray lamp used for annealing, etc. may be utilized in the same manner as a microwave-generating source.

Although the above-mentioned embodiments described examples involving electrostatic clamping of substrates heated to a predetermined temperature, the problem of substrate warpage and stress is also encountered when substrates are cooled. Since the mechanism of warpage and stress generation is the same as during heating, substrate warpage and stress during cooling can also be minimized by applying the present invention.

If the substrate 5 is cooled, in the above-described embodiment, the temperature-regulating portion 3 serves as a channel for a cooling medium, such as water, Galden, or the like. In addition, the heating power supply 8 serves as a chiller unit used to circulate the cooling medium through the cooling medium channel. In addition, if both heating and cooling are performed, then the inventive temperature-regulating portion 3 is provided with heating elements used for heating and with a channel used for cooling, and the heating power supply 8 can serve both as a heating power supply 8 and as a chiller unit.

In addition, while the embodiment of FIG. 1 described an example in which the chuck body 1 was disposed in the processing chamber 6, it does not necessarily have to be disposed in the processing chamber 6. A vacuum environment is maintained in the interior of the semiconductor fabrication device, and sometimes the heating or cooling and electrostatic clamping of a substrate may be performed before transporting the substrate to the processing chamber. For example, there are semiconductor fabrication devices equipped with a pre-heating chamber or a preliminary cooling chamber intended for making the temperature of the substrates somewhat higher or lower in advance of being transported into the processing chamber.

Application of the present invention to such a pre-heating chamber or preliminary cooling chamber allows for producing the effects of the above-described embodiments. Thus, applying the present invention to a semiconductor fabrication device produces an arrangement wherein at least the chuck body 1 of the above-described electrostatic chuck system is disposed in a compartment under vacuum (vacuum vessel).

Furthermore, although, depending upon the number of the electrodes constituting the electrode portion 2 the drive schemes of the electrostatic chuck differ in terms of whether voltage is applied to the electrodes at all times or whether voltage is applied to the electrodes at certain times only, the present invention allows for any drive schemes to be used.

In addition, while in the above-described embodiments the explanations are based on examples in which the second waveform is a rectangular wave or a saw-tooth wave, the invention is not limited to these waveforms, and a triangular wave or a sine wave may also be employed. In the case of a triangular wave and a sine wave, effects equivalent to those of the saw-tooth wave can be obtained and, in addition, the period and amplitude of these waveforms can be modified depending on substrate temperature measurement results.

While the above-described embodiments measured the temperature of the substrate, in addition to that, it is also possible to measure the degree of clamping of the substrate 5 to the clamping face 4. As far as the degree of clamping is concerned, it is possible, for example, to measure the capacitance present between the clamping face 4 and the substrate 5 and shape the voltage waveform applied to the electrode portion 2 by taking the results of the capacitance measurements into consideration.

Other than as described above, various other improvements and modifications may of course be made without departing from the main concept of the invention.

DESCRIPTION OF THE REFERENCE NUMERALS

1. Chuck body
2. Electrode portion
3. Temperature-regulating portion
4. Clamping face
5. Substrate
10. Controller
E. Electrostatic chuck

The invention claimed is:

1. An electrostatic chuck system comprising a chuck body having a clamping face for electrostatically clamping a substrate, an electrode portion generating a clamping force on the clamping face, a temperature-regulating portion regulating the temperature of the substrate to maintain it at a predetermined level, and a controller controlling the voltage applied to the electrode portion, wherein, prior to completion of the electrostatic clamping of the substrate to the chuck body, the controller applies voltage to the electrode portion based on a voltage waveform obtained by superimposing a first waveform, which changes in a stepwise, rectilinear, or quadratic manner between a first level and a second level of a larger absolute value than the first level, and a periodic second waveform, which may be any of a rectangular wave, a triangular wave, a saw-tooth wave, or a sine wave.

2. The electrostatic chuck system according to claim 1, wherein the amplitude of the second waveform is constant over time.

3. The electrostatic chuck system according to claim 1, wherein the second waveform is a rectangular wave and the controller modifies at least one of a duty ratio, a period, or an amplitude of the second waveform based at least on the temperature of the substrate.

4. The electrostatic chuck system according to claim 1, wherein the second waveform is any of a triangular wave, a saw-tooth wave, or a sine wave and the controller modifies at least one of a period or an amplitude of the second waveform based at least on the temperature of the substrate.

5. The electrostatic chuck system according to claim 1, wherein the second waveform is any of a triangular wave, a saw-tooth wave, or a sine wave and the controller increases the amplitude of the second waveform over time.

6. The electrostatic chuck system according to claim 1, wherein the magnitude of the voltage applied by the voltage waveform is greater than 0V in absolute value, except at the start of electrostatic clamping.

7. A semiconductor fabrication device provided with the electrostatic chuck system according to claim 1 and a vacuum vessel in which the chuck body of the electrostatic chuck system is disposed.

* * * * *